US008796890B2

(12) United States Patent
Chen et al.

(10) Patent No.: US 8,796,890 B2
(45) Date of Patent: Aug. 5, 2014

(54) POWER CONTROL MODULE

(75) Inventors: Yen-Chih Chen, Taipei (TW); Yi-Hsun Lin, Taipei (TW); Wei-Chih Shih, Taipei (TW); Huang-Kai Lo, Taipei (TW)

(73) Assignee: Compal Electronics, Inc., Taipei (TW)

( * ) Notice: Subject to any disclaimer, the term of this patent is extended or adjusted under 35 U.S.C. 154(b) by 490 days.

(21) Appl. No.: 13/217,295

(22) Filed: Aug. 25, 2011

(65) Prior Publication Data
US 2012/0119817 A1    May 17, 2012

Related U.S. Application Data

(60) Provisional application No. 61/412,399, filed on Nov. 11, 2010.

(51) Int. Cl.
*F16P 3/20* (2006.01)
(52) U.S. Cl.
USPC ............................................. 307/328
(58) Field of Classification Search
USPC ............................................. 307/328
See application file for complete search history.

(56) References Cited

U.S. PATENT DOCUMENTS 4,346,419 A * 8/1982 Janniello ............................ 361/2
4,897,055 A * 1/1990 Jurista et al. ............... 439/699.1

FOREIGN PATENT DOCUMENTS

TW        555253        9/2003

OTHER PUBLICATIONS

"Office Action of Taiwan Counterpart Application", issued on Mar. 24, 2014, pp. 1-5.

* cited by examiner

*Primary Examiner* — Robert L. Deberadinis
(74) *Attorney, Agent, or Firm* — Jianq Chyun IP Office

(57) ABSTRACT

A power control module including a socket, a switch circuit and an interface control circuit is provided. A plug is adapted to be inserted into the socket, and the socket has a positive terminal, a first negative terminal and a second negative terminal. When the plug is inserted into the socket, a negative terminal of the plug sequentially contacts the first negative terminal and the second negative terminal. The switch circuit receives a power voltage through the positive terminal. The interface control circuit determines whether to generate a switching signal to the switch circuit according to a voltage level of the second negative terminal. When receiving the switching signal, the switch circuit outputs the power voltage.

10 Claims, 3 Drawing Sheets

POWER CONTROL MODULE

CROSS-REFERENCE TO RELATED APPLICATION

This application claims the priority benefits of U.S. provisional application Ser. No. 61/412,399, filed on Nov. 11, 2010. The entirety of the above-mentioned patent application is hereby incorporated by reference herein and made a part of this specification.

BACKGROUND OF THE INVENTION

1. Field of the Invention

The invention relates to a power control module. Particularly, the invention relates to a power control module capable of enabling or disabling a power supply function according to a contact state between a plug and a socket.

2. Description of Related Art

Power supply of a portable electronic device is generally controlled by a power control module. Generally, the power control module can be connected to a power adapter through a power socket, so as to use an external power to supply power to the whole system (for example, supply an operating voltage of an internal circuit and charge a battery, etc.). Therefore, the power control module is an indispensable component of the portable electronic device, which is continuously ameliorated by various manufacturers. However, there are still many problems in safety and reliability of the power control module.

For example, in an actual operation, a plug is probably not inserted into the power socket completely, and the power socket and the plug have a poor contact. Such abnormal contact state may increase a contact impedance between the plug and the power socket, which may result in a fact that a temperature of the power control module is continually increased. Moreover, once the above situation lasts for a long time, a plastic mechanism in the module is probably deformed, or even the whole power control module is burned. In addition, the power socket may become loose during utilization to cause a poor contact between the power socket and the plug, which may also cause the above problem.

Therefore, it is an important issue to be developed in design of the power control module to avoid overheat or burn-out of the power control module due to a poor contact between the power socket and the plug.

SUMMARY OF THE INVENTION

The invention is directed to a power control module, which is capable of enabling or disabling a power supply function according to a contact state between a plug and a socket. In this way, overheat or burn-out of the power control module caused by a poor contact between the power socket and the plug is avoided.

The invention provides a power control module including a socket, a switch circuit and an interface control circuit. The socket is adapted for a plug to be inserted, and has a positive terminal, a first negative terminal and a second negative terminal. When the plug is inserted into the socket, a negative terminal of the plug sequentially contacts the first negative terminal and the second negative terminal. The switch circuit receives a power voltage through the positive terminal. The interface control circuit determines whether or not to generate a switching signal to the switch circuit according to a voltage level of the second negative terminal. The switch circuit outputs the power voltage when receiving the switching signal.

In an embodiment of the invention, when the second negative terminal is floating, the interface control circuit does not generate the switching signal, and when the second negative terminal is grounded, the interface control circuit generates the switching signal.

In an embodiment of the invention, the first negative terminal is closer to an opening of the socket than the second negative terminal is to the opening of the socket.

In an embodiment of the invention, the power control module further includes a voltage converter for converting the power voltage into an operating voltage required by the interface control circuit. Moreover, the voltage converter is disposed in the interface control circuit or the switch circuit.

According to the above descriptions, the socket has two negative terminals, and when the plug is inserted into the socket, the plug sequentially contacts the first negative terminal and the second negative terminal. Therefore, the interface control circuit determines a contact state between the socket and the plug according to the voltage level of the second negative terminal of the socket, and controls the switch circuit according to a determination result. In this way, the power control module is capable of enabling or disabling a power supply function according to the contact state between the plug and the socket, so as to avoid overheat or burn-out of the power control module caused by a poor contact between the power socket and the plug.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
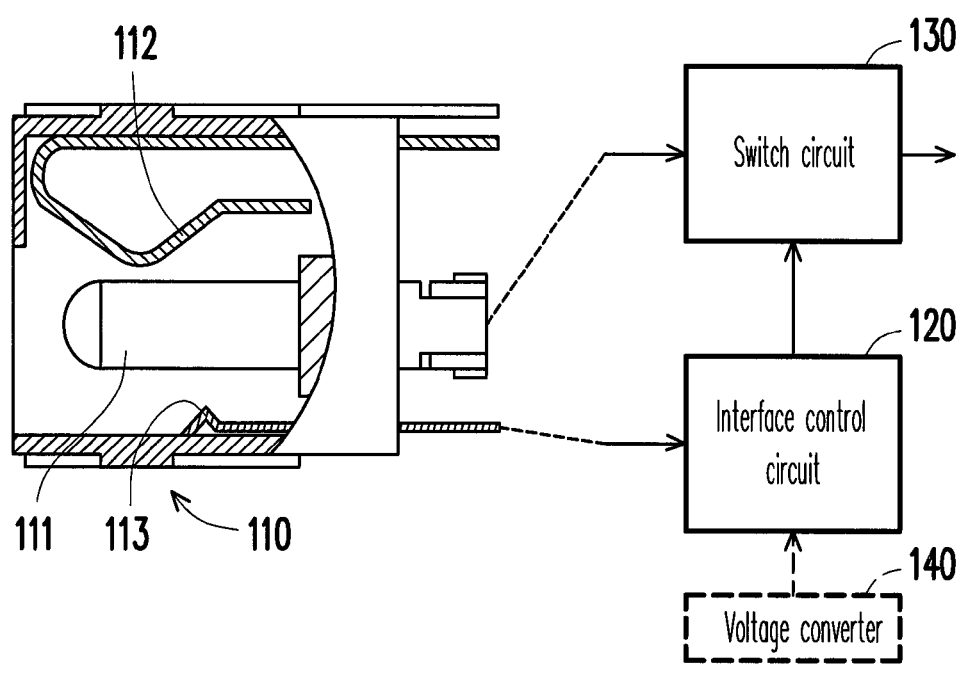
FIG. 1 is a schematic diagram of a power control module according to an embodiment of the invention.

FIG. 1 is a schematic diagram of a power control module according to an embodiment of the invention. Referring to FIG. 1, the power control module 100 includes a socket 110, an interface control circuit 120 and a switch circuit 130. In an actual application, the power control module 100 can be applied/implemented in a portable electronic device, so that the electronic device can be connected to an external power adapter through the socket 110 in the power control module 100. The portable electronic device is for example a notebook computer. The socket 110 is adapted to accommodate insertion of a plug, and has a positive terminal 111, a first negative terminal 112 and a second negative terminal 113.

Figure 2A:
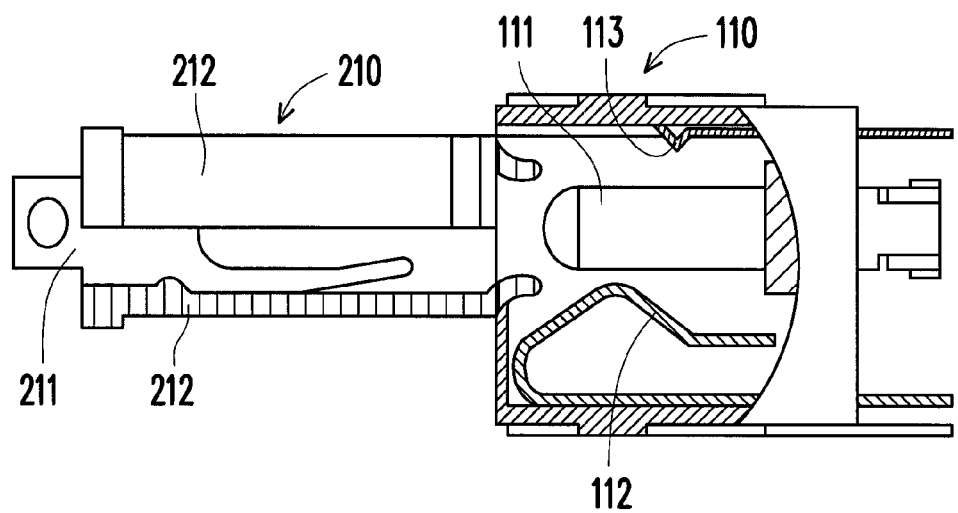
FIG. 2A and FIG. 2B are schematic diagrams respectively illustrating situations before and after a plug is inserted into a socket.
Figure 2B:
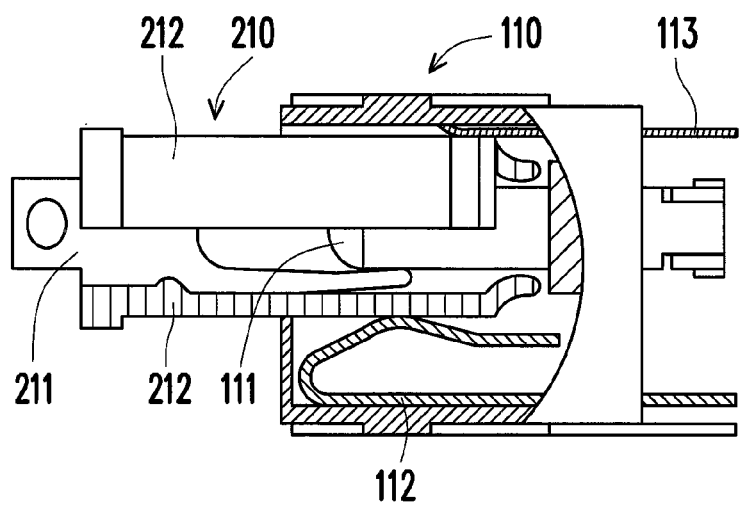

For example, FIG. 2A and FIG. 2B are schematic diagrams respectively illustrating situations before and after a plug is inserted into a socket. As shown in FIG. 2A, a plug 210 is adapted to be inserted into the socket 110. Moreover, along an axial direction of the socket 110, the first negative terminal 112 is closer to the opening of the socket 110 than a tip of the positive terminal 111, and the second negative terminal 113 is disposed behind the tip of the positive terminal 111. In other words, in configuration, the first negative terminal 112 is closer to the opening of the socket 110, and the second negative terminal 113 is far away from the opening of the socket 110.

As shown in FIG. 2B, when the plug 210 is inserted into the socket 110, a negative terminal 212 of the plug 210 first contacts the first negative terminal 112 of the socket 110, and then contacts the second negative terminal 113 of the socket 110. In other words, when the plug 210 is inserted into the socket 110, the plug 210 sequentially contacts the first negative terminal 112, the positive terminal 111 and the second negative terminal 113, so as to sequentially pull down voltage levels of the first negative terminals 112 and the second negative terminal 113 to a ground voltage. Moreover, a positive terminal 211 of the plug 210 is electrically connected to the positive terminal 111 of the socket 110, so that the power control module 100 can receive an external power voltage, for example, a voltage generated by a power adaptor connected to the socket 110.

In one aspect, when the plug 210 is not completely/fully inserted into the socket 110, the negative terminal 212 of the plug 210 cannot contact the second negative terminal 113 of the socket 110, and the second negative terminal 113 of the socket 110 is floating. Comparatively, when the plug 210 is completely inserted into the socket 110, the second negative terminal 113 of the socket 110 is grounded. In other words, a contact state between the plug 210 and the socket 110 can be determined according to a voltage level of the second negative terminal 113 of the socket 110.

Referring to FIG. 1, the interface control circuit 120 is electrically connected to the second negative terminal 113 of the socket 110, and determines whether or not to generate a switching signal according to the voltage level of the second negative terminal 113. For example, when the plug 210 is not completely inserted into the socket 110, although the contact state between the plug 210 and the socket 110 includes: (1) the negative terminal 212 of the plug 210 only contacts the first negative terminal 112 of the socket 110; (2) the plug 210 contacts the first negative terminal 112 and the positive terminal 111 of the socket 110, but the contact between the plug 210 and the positive terminal 111 of the socket 110 is unstable. The second negative terminal 113 is floating in either condition, and thus the interface control circuit 120 does not generate the switching signal. Comparatively, when the plug 210 is completely inserted into the socket 110, the voltage level of the second negative terminal 113 is the ground voltage, so that the interface control circuit 120 generates the switching signal.

On the other hand, the switch circuit 130 receives an external power voltage through the positive terminal 111 of the socket 110. Moreover, the switch circuit 130 outputs the power voltage to the portable electronic device when receiving the switching signal, so as to allow the external power voltage be supplied to the system of the portable electronic device. In other words, a power supply function is enabled. Comparatively, when the plug 210 is not completely inserted into the socket 110, the interface control circuit 120 does not generate the switching signal. Since the switch circuit 130 does not receive the switching signal, it does not output the external power voltage to the portable electronic device, and therefore the power supply function is disabled.

In other words, the interface control circuit 120 determines the contact state of the plug 210 and the socket 110 according to the voltage level of the second negative terminal 113 of the socket 110, and accordingly determines whether or not to generate the switching signal. Moreover, the switch circuit 130 determines whether or not to output the external power voltage according to whether or not the switching signal is received. In this way, the power control module 100 is capable of enabling or disabling the external power-to-system power supply function according to the contact state between the plug 210 and the socket 110. Therefore, overheat or burn-out of the power control module 100 caused by a poor contact between the socket and the plug can be avoided, and safety and reliability of the system are improved.

Figure 3:
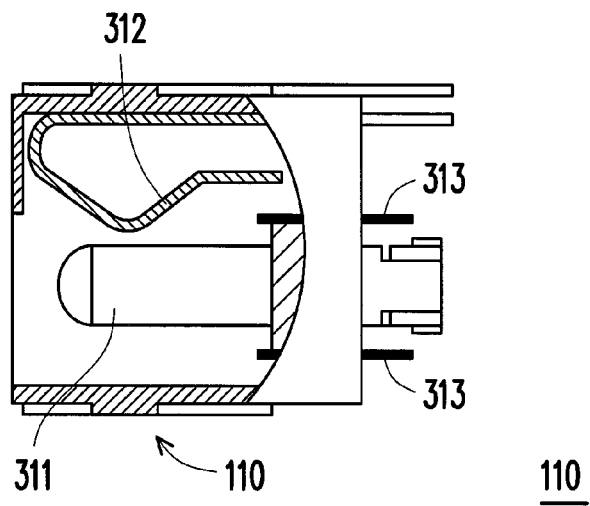
FIG. 3 is a structural schematic diagram of a socket according to another embodiment of the invention.

It should be noticed that in the embodiment of FIG. 1, the first negative terminal 112 and the second negative terminal 113 of the socket 110 are all formed by an elastic piece/spring piece. Although an embodiment of the negative terminals is provided in the embodiment of FIG. 1, the invention is not limited thereto. For example, FIG. 3 is a structural schematic diagram of a socket according to another embodiment of the invention. Referring to FIG. 3, the socket 110 includes a positive terminal 311, a first negative terminal 312 and a second negative terminal 313, where the first negative terminal 312 is formed by an elastic piece, and the second negative terminal 313 is formed by a pin, for example, a pogo-pin. In configuration, the first negative terminal 312 is closer to the opening of the socket 110 than the second negative terminal 313 is to the opening of the socket 110. Therefore, when the plug is inserted into the socket 110, the plug sequentially contacts the first negative terminal 312 and the second negative terminal 313.

Moreover, the interface control circuit 120 of FIG. 1 requires an operating voltage to maintain operations of its own internal circuits. Therefore, in an actual application, if the external power voltage transmitted by the socket 110 is equal to the operating voltage of the interface control circuit 120, the interface control circuit 120 can be electrically connected to the positive terminal 111 of the socket 110 to obtain the required operating voltage. On the other hand, if the external power voltage is higher than or lower than the operating voltage of the interface control circuit 120, the power control module 100 can convert the external power voltage into the operating voltage required by the interface control circuit 120 through a voltage converter 140. The voltage converter 140 can be disposed in the interface control circuit 120 or the switch circuit 130. In other words, those skilled in the art can determine whether or not to set the voltage converter 140 in the power control module 400 according to a design requirement.

Figure 4:
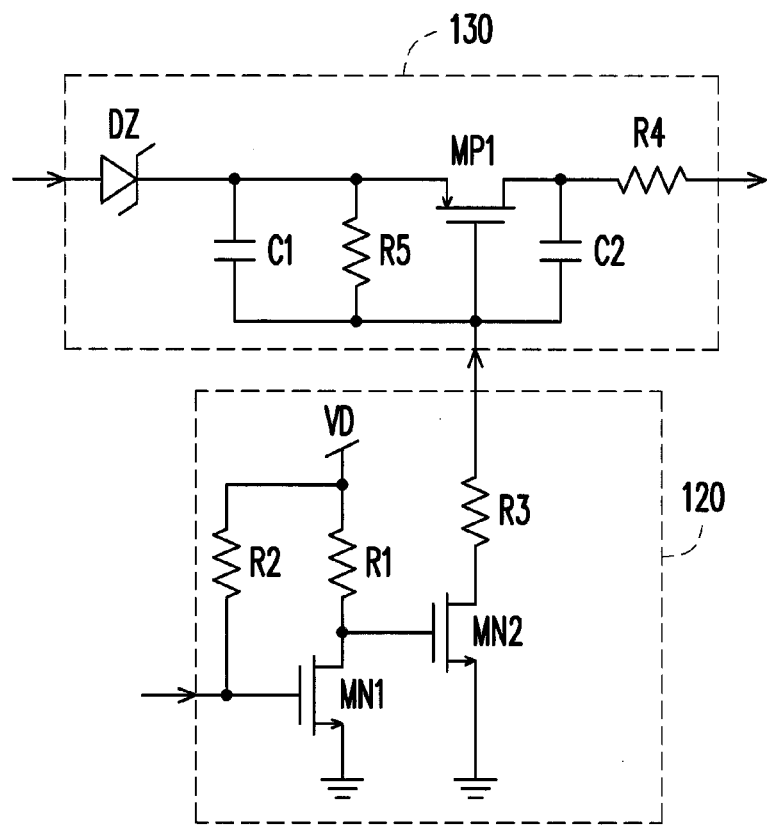
FIG. 4 is a circuit diagram of an interface control circuit and a switch circuit according to an embodiment of the invention.

In order to fully convey the spirit of the invention to those skilled in the art, another embodiment is provided below. FIG. 4 is a circuit diagram of an interface control circuit and a switch circuit according to an embodiment of the invention. The interface circuit 120 and the switch circuit 130 are described in detail below with reference to FIG. 4.

Referring to FIG. 4, the interface control circuit 120 includes resistors R1-R3 and N-type transistors MN1 and MN2. A first end of the resistor R1 receives an operating voltage VD. A drain of the N-type transistor MN1 is electrically connected to a second end of the resistor R1, a gate of the N-type transistor MN1 is electrically connected to the second negative terminal 113 of the socket 110, and a source of the N-type transistor MN1 is electrically connected to the ground. A first end of the resistor R2 receives the operating voltage VD, and a second end of the resistor R2 is electrically connected to the gate of the N-type transistor MN1. A gate of the N-type transistor MN2 is electrically connected to the drain of the N-type transistor MN1, and a source of the N-type transistor MN2 is electrically connected to the ground. A first end of the resistor R3 is electrically connected to the switch circuit 130, and a second end of the resistor R3 is electrically connected to a drain of the N-type transistor MN2.

In operation, when the plug 210 is not completely inserted into the socket 110, the second negative terminal 113 of the socket 110 is in the floating state. At this time, a voltage drop across the resistor R2 caused by the operating voltage VD turns on the N-type transistor MN1. As the N-type transistor MN1 is turned on, a voltage level of the gate of the N-type transistor MN2 is pulled down to the ground voltage. Therefore, the N-type transistor MN2 cannot be turned on, so that the interface control circuit 120 cannot generate the switching signal.

On the other hand, when the plug 210 is completely inserted into the socket 110, the voltage level of the second negative terminal 113 of the socket 110 is the ground voltage. Hence, the voltage level of the gate of the N-type transistor MN1 is accordingly pulled down to the ground voltage, so that the N-type transistor MN1 cannot be turned on. Moreover, since the N-type transistor MN1 is not turned on, a voltage drop across the resistor R1 caused by the operating voltage VD turns on the N-type transistor MN2, so that the voltage level of the drain of the N-type transistor MN2 is pulled down to the ground voltage. In this way, the interface control circuit 120 outputs the switching signal (i.e. the ground voltage) through the resistor R3.

Referring to FIG. 4, the switch circuit 130 includes a Zener diode DZ, a P-type transistor MP1, resistors R4-R5 and capacitors C1-C2. An anode of the Zener diode DZ is electrically connected to the positive terminal 111 of the socket 110. A source of the P-type transistor MP1 is electrically connected to a cathode of the Zener diode DZ, and a gate of the P-type transistor MP1 is electrically connected to the interface control circuit 120. The resistor R4 is electrically connected to a drain of the P-type transistor MP1. A first end of the capacitor C1 is electrically connected to the source of the P-type transistor MP1, and a second end of the capacitor C1 is electrically connected to the gate of the P-type transistor MP1. The resistor R5 and the capacitor C1 are connected in parallel. A first end of the capacitor C2 is electrically connected to the drain of the P-type transistor MP1, and a second end of the capacitor C2 is electrically connected to the gate of the P-type transistor MP1.

In operation, when the plug 210 is not completely inserted into the socket 110, the interface control circuit 120 cannot generate the switching signal. Therefore, the gate of the P-type transistor MP1 is floating, so that the P-type transistor MP1 cannot be turned on. Comparatively, as the P-type transistor MP1 is not turned on, the switch circuit 130 cannot output the external power voltage, so that the power supply function is disabled.

On the other hand, when the plug 210 is completely inserted into the socket 110, the interface control circuit 120 outputs the switching signal (i.e. the ground voltage) through the resistor R3. Now, the voltage level of the gate of the P-type transistor MP1 is pulled down to the ground voltage, so that the P-type transistor MP1 is turned on. Comparatively, as the P-type transistor MP1 is turned on, the switch circuit 130 outputs the external power voltage, so that the power supply function is enabled. The Zener diode DZ is used for rectifying the external power voltage, and the capacitors C1 and C2 and the resistor R5 are used for adjusting a turn-on rate of the P-type transistor MP1.

In summary, the socket has two negative terminals, and when the plug is inserted into the socket, the plug sequentially contacts the first negative terminal and the second negative terminal. Therefore, the interface control circuit determines a contact state between the socket and the plug according to the voltage level of the second negative terminal of the socket, and controls the switch circuit according to a determination result. In this way, the power control module is capable of enabling or disabling a power supply function according to the contact state between the plug and the socket, so as to avoid overheat or burn-out of the power control module caused by a poor contact between the power socket and the plug, and improve the safety and reliability of the system.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power control module, comprising:
    a socket, adapted for a plug to be inserted, and having a positive terminal, a first negative terminal and a second negative terminal, wherein when the plug is inserted into the socket, a negative terminal of the plug sequentially contacts the first negative terminal and the second negative terminal;
    a switch circuit, for receiving a power voltage through the positive terminal; and
    an interface control circuit, for determining whether or not to generate a switching signal to the switch circuit according to a voltage level of the second negative terminal, wherein the switch circuit outputs the power voltage when receiving the switching signal.

2. The power control module as claimed in claim 1, wherein when the second negative terminal is floating, the interface control circuit does not generate the switching signal, and when the second negative terminal is grounded, the interface control circuit generates the switching signal.

3. The power control module as claimed in claim 1, wherein the first negative terminal is relatively closer to an opening of the socket than the second negative terminal.

4. The power control module as claimed in claim 1, wherein the first negative terminal is an elastic piece.

5. The power control module as claimed in claim 1, wherein the second negative terminal is an elastic piece or a pogo pin.

6. The power control module as claimed in claim 1, wherein the interface control circuit comprises:
    a first resistor, having a first end for receiving an operating voltage;
    a first N-type transistor, having a drain electrically connected to a second end of the first resistor, a gate electrically connected to the second negative terminal, and a source electrically connected to ground;
    a second resistor, having a first end for receiving the operating voltage, and a second end electrically connected to the gate of the first N-type transistor;
    a second N-type transistor, having a gate electrically connected to the drain of the first N-type transistor, and a source electrically connected to the ground; and
    a third resistor, having a first end electrically connected to the switch circuit, and a second end electrically connected to a drain of the second N-type transistor.

7. The power control module as claimed in claim 1, wherein the switch circuit comprises:

a Zener diode, having an anode electrically connected to the positive terminal;

a first P-type transistor, having a source electrically connected to a cathode of the Zener diode, and a gate electrically connected to the interface control circuit;

a fourth resistor, electrically connected to a drain of the first P-type transistor;

a first capacitor, having a first end electrically connected to the source of the first P-type transistor, and a second end electrically connected to the gate of the first P-type transistor;

a fifth resistor, connected in parallel with the first capacitor; and a second capacitor, having a first end electrically connected to the drain of the first P-type transistor, and a second end electrically connected to the gate of the first P-type transistor.

8. The power control module as claimed in claim 1, further comprising:

a voltage converter, for converting the power voltage into an operating voltage required by the interface control circuit.

9. The power control module as claimed in claim 8, wherein the voltage converter is disposed in the interface control circuit or the switch circuit.

10. The power control module as claimed in claim 1, wherein when the plug is inserted into the socket, the plug first contacts the positive terminal, and then contacts the second negative terminal.

* * * * *